United States Patent
Yoshino et al.

(10) Patent No.: US 11,162,057 B2
(45) Date of Patent: Nov. 2, 2021

(54) COMPOSITION FOR SURFACE TREATMENT, METHOD FOR PRODUCING COMPOSITION FOR SURFACE TREATMENT, SURFACE TREATMENT METHOD, AND METHOD FOR PRODUCING SEMICONDUCTOR SUBSTRATE

(71) Applicant: FUJIMI INCORPORATED, Aichi (JP)

(72) Inventors: Tsutomu Yoshino, Aichi (JP); Ayano Yamazaki, Aichi (JP); Shogo Onishi, Aichi (JP); Yasuto Ishida, Aichi (JP); Satoru Yarita, Aichi (JP)

(73) Assignee: FUJIMI INCORPORATED

( * ) Notice: Subject to any disclaimer, the term of this patent is extended or adjusted under 35 U.S.C. 154(b) by 0 days.

(21) Appl. No.: 16/127,690

(22) Filed: Sep. 11, 2018

(65) Prior Publication Data
US 2019/0093056 A1 Mar. 28, 2019

(30) Foreign Application Priority Data

Sep. 22, 2017 (JP) .............................. JP2017-182903
Mar. 14, 2018 (JP) .............................. JP2018-046471

(51) Int. Cl.
| | | |
|---|---|---|
| C11D 7/08 | (2006.01) | |
| C11D 7/26 | (2006.01) | |
| C11D 7/34 | (2006.01) | |
| C11D 7/36 | (2006.01) | |
| H01L 21/02 | (2006.01) | |
| B08B 3/04 | (2006.01) | |
| C11D 11/00 | (2006.01) | |
| C11D 3/37 | (2006.01) | |

(52) U.S. Cl.
CPC ........ *C11D 11/0047* (2013.01); *C11D 3/3707* (2013.01); *C11D 7/08* (2013.01); *C11D 7/263* (2013.01); *C11D 7/265* (2013.01); *C11D 7/34* (2013.01); *C11D 11/0094* (2013.01); *H01L 21/02065* (2013.01); *H01L 21/02074* (2013.01)

(58) Field of Classification Search
None
See application file for complete search history.

(56) References Cited

U.S. PATENT DOCUMENTS

| | | | |
|---|---|---|---|
| 6,793,846 B2 * | 9/2004 | Yoshikawa | A01N 59/00 252/187.24 |
| 9,365,802 B2 | 6/2016 | Harada et al. | |
| 2005/0176604 A1 * | 8/2005 | Lee | C11D 3/042 510/175 |
| 2006/0214133 A1 * | 9/2006 | Yamashita | H01L 21/3212 252/186.1 |
| 2010/0167535 A1 * | 7/2010 | Nishiwaki | C11D 3/2075 438/669 |
| 2011/0136717 A1 * | 6/2011 | Tamboli | C11D 3/30 510/176 |
| 2013/0034505 A1 * | 2/2013 | Lepilleur | A61K 8/737 424/47 |
| 2013/0181159 A1 * | 7/2013 | Tsuchiya | C11D 1/825 252/79.1 |
| 2014/0014872 A1 * | 1/2014 | Tamada | C09G 1/02 252/79.1 |
| 2014/0369953 A1 * | 12/2014 | Purschwitz | A01N 31/14 424/78.36 |
| 2015/0159330 A1 * | 6/2015 | Weisman | D04H 1/4309 162/134 |
| 2015/0291851 A1 * | 10/2015 | Asano | C09G 1/02 451/28 |
| 2017/0152495 A1 * | 6/2017 | Balumuri | C12N 15/09 |
| 2017/0275498 A1 * | 9/2017 | Tamada | C09K 3/1463 |
| 2018/0043497 A1 * | 2/2018 | Hanano | C09G 1/02 |
| 2018/0072917 A1 * | 3/2018 | Kobayashi | H01L 21/3212 |
| 2020/0024547 A1 * | 1/2020 | Ishida | H01L 21/02074 |

FOREIGN PATENT DOCUMENTS

JP 2012-74678 A 4/2012

* cited by examiner

*Primary Examiner* — Lorna M Douyon
(74) *Attorney, Agent, or Firm* — Katten Muchin Rosenman LLP

(57) ABSTRACT

A composition for surface treatment according to the present invention is used for treating the surface of an object to be polished after polishing, the composition for surface treatment including: a water-soluble polymer having a constituent unit derived from glycerin; an acid; and water, wherein the composition for surface treatment has a pH of 5 or lower.

12 Claims, No Drawings

COMPOSITION FOR SURFACE TREATMENT, METHOD FOR PRODUCING COMPOSITION FOR SURFACE TREATMENT, SURFACE TREATMENT METHOD, AND METHOD FOR PRODUCING SEMICONDUCTOR SUBSTRATE

CROSS-REFERENCE TO RELATED APPLICATION

The present patent application is based on Japanese Patent Application No. 2017-182903, filed on Sep. 22, 2017, and Japanese Patent Application No. 2018-046471, filed Mar. 14, 2018, the entire disclosure of which is incorporated herein by reference.

BACKGROUND

1. Technical Field

The present invention relates to a composition for surface treatment, a method for producing a composition for surface treatment, a surface treatment method, and a method for producing a semiconductor substrate.

2. Description of Related Arts

In recent years, along with multilayer wiring of semiconductor substrate surfaces, so-called chemical mechanical polishing (CMP) technologies of polishing and flattening a semiconductor substrate have been utilized when devices are produced. CMP is a method of flattening the surface of an object to be polished (material to be polished) such as a semiconductor substrate by using a polishing composition (slurry) including abrasive grains such as silica, alumina, ceria or the like, an anticorrosive agent, a surfactant, and the like, and the object to be polished (material to be polished) may be a wiring, a plug, or the like formed from, for example, silicon, polysilicon, a silicon oxide film (silicon oxide), silicon nitride, or a metal.

On the surface of a semiconductor substrate after a CMP process, impurities (defects) remain in large quantities. Examples of the impurities include abrasive grains, metal residues, organic materials such as an anticorrosive agent and a surfactant, which are derived from the polishing composition used in CMP; silicon-containing materials, which are objects to be polished; silicon-containing materials or metal residues produced by polishing a metal wiring, a plug or the like; and organic materials such as pad wastes produced from various pads and the like.

When a semiconductor substrate surface is contaminated by these impurities, the electrical characteristics of the semiconductor may be adversely affected, and reliability of the device may be lowered. Therefore, it is desirable that a cleaning process is introduced after the CMP process, and these impurities are eliminated from the semiconductor substrate surface.

Regarding a cleaning liquid (cleaning composition) used in such a cleaning process, for example, it is disclosed in JP 2012-74678 A (corresponding to US 2013/174867 A) that foreign materials can be removed, without corroding the substrate surface, by using a cleaning composition for a semiconductor substrate, the cleaning composition including a polycarboxylic acid or a hydroxycarboxylic acid, a sulfonic acid-type anionic surfactant, a carboxylic acid type anionic surfactant, and water.

SUMMARY

However, in the technology applied in the above-described document, there is a problem that on the occasion of cleaning an object to be polished after polishing, defects cannot be sufficiently removed.

Here, the inventors of the present invention conducted an investigation on the relationship between the type of the object to be polished after polishing and the type of defect. As a result, the inventors found that an object to be polished after polishing containing silicon nitride, silicon oxide, or polysilicon, all of which are particularly preferably used as semiconductor substrates, is likely to have organic residues easily attached thereto, and such organic residues may cause destruction of semiconductor devices.

The present invention was achieved in view of the problems described above, and it is an object of the invention to provide a means by which organic residues existing on the surface of an object to be polished after polishing can be sufficiently removed.

The inventors of the present invention conducted a thorough investigation in view of the problems described above. As a result, the inventors found that when a composition for surface treatment that includes a water-soluble polymer having a constituent unit derived from glycerin, an acid, and water and has a pH of 5 or lower is used, the effect of removing organic residues on the surface of the object to be polished after polishing is improved. Thus, the inventors completed the present invention.

DETAILED DESCRIPTION

In the following description, embodiments of the present invention will be explained. Meanwhile, the invention is not intended to be limited to the following embodiments only. Furthermore, according to the present specification, unless particularly stated otherwise, the operations and measurement of physical properties are carried out under the conditions of room temperature (from 20° C. to 25° C.)/a relative humidity of from 40% RH to 50% RH.

Furthermore, in the present specification, the description "(meth)acryl" in the specific name of a compound means "acryl" and "methacryl", and the description "(meth)acrylate" means "acrylate" and "methacrylate".

[Organic Residues]

In the present specification, an organic residue represents a component formed from an organic substance such as an organic low molecular weight compound or a polymer compound, or an organic salt, among the foreign materials adhering to the surface of an object to be polished after polishing (hereinafter, also simply referred to as "an object to be cleaned").

Examples of the organic residues adhering to an object to be cleaned include pad wastes generated from the pads used in a polishing process or a rinse polishing process that may be optionally provided, which are described below; and the components originating from the additives included in the polishing composition used in the polishing process or in the composition for rinse polishing used in a rinse polishing process.

Since the organic residues and other foreign materials are significantly different in color and shape, the determination of whether a foreign material is an organic residue can be made by visual inspection by SEM observation, and if necessary, the determination may also be made by performing an elemental analysis performed using an energy dispersive X-ray spectroscopy (EDX).

[Object to be Polished After Polishing]

In the present specification, the object to be polished after polishing means an object to be polished after being polished in a polishing process. The polishing process is not particularly limited; however, it is preferable that the polishing process is a CMP process.

It is preferable that the composition for surface treatment according to an embodiment of the present invention is used in order to reduce organic residues remaining on the surface of an object to be polished after polishing containing silicon nitride (hereinafter, also simply referred to as "SiN"), silicon oxide, or polysilicon (hereinafter, also simply referred to as "Poly-Si"). Examples of the object to be polished after polishing containing silicon oxide include a tetraethyl orthosilicate (TEOS) type silicon oxide surface (hereinafter, also simply referred to as "TEOS") produced by using tetraethyl orthosilicate as a precursor, a high density plasma (HDP) film, an undoped silicate glass (USG) film, a phosphorus silicate glass (PSG) film, a boron-phospho silicate glass (BPSG) film, and a rapid thermal oxidation (RTO) film.

The object to be polished after polishing is preferably a polished semiconductor substrate, and more preferably a semiconductor substrate after CMP. This is because since organic residues in particular may cause destruction of the semiconductor device, in a case in which the object to be polished after polishing is a polished semiconductor substrate, the cleaning process for a semiconductor substrate needs to be a process capable of removing organic residues as much as possible.

The object to be polished after polishing containing silicon nitride, silicon oxide, or polysilicon is not particularly limited; however, examples include an object to be polished after polishing formed from the simple substance of each of silicon nitride, silicon oxide, and polysilicon, and an object to be polished after polishing that is in a state in which silicon nitride, silicon oxide, or polysilicon as well as a material other than these materials is exposed to the surface. Here, examples of the former include a silicon nitride substrate, a silicon oxide substrate, and a polysilicon substrate, which are semiconductor substrate. Also, in regard to the latter, there are no particular limitations on the material other than silicon nitride, silicon oxide, or polysilicon, and for example, tungsten may be used. Specific examples of such an object to be polished after polishing include a polished semiconductor substrate having a structure in which a silicon nitride film, a silicon oxide film, or a polysilicon film is formed on tungsten; and a polished semiconductor substrate having a structure in which a tungsten part, a silicon nitride film, a silicon oxide film, and a polysilicon film are all exposed.

Here, from the viewpoint of the effect provided by the present invention, it is preferable that the object to be polished after polishing according to an embodiment of the present invention contains polysilicon.

[Composition for Surface Treatment]

An embodiment of the present invention is a composition for surface treatment comprising a water-soluble polymer having a constituent unit derived from glycerin, an acid, and water, and having a pH of 5 or lower, used for treating the surface of an object to be polished after polishing.

It is particularly preferable that the composition for surface treatment according to an embodiment of the present invention is used as an organic residue reducing agent for selectively removing an organic residue in a surface treatment process.

The inventors of the present invention speculate the mechanism by which the problems described above are solved by the invention, as follows.

The composition for surface treatment has a function of removing foreign materials on the surface of an object to be polished after polishing, or a function of facilitating the removal of foreign materials, by a chemical interaction between the various components included in the composition for surface treatment and the surface of the object to be polished after polishing as well as the foreign materials.

The water-soluble polymer having a constituent unit derived from glycerin, which is included in the composition for surface treatment, forms a hydrophilic layer on the surface of the object to be polished after polishing, and also forms a hydrophilic layer on the surface of the organic residue. The organic residue having a hydrophilic layer formed thereon has an affinity with the hydrophilized surface of the object to be polished after polishing, and therefore, the organic residue adheres to the surface of the object to be polished after polishing during the surface treatment process. Thereafter, the hydrophilic layer on the surface of the object to be polished after polishing is easily removed by a process such as cleaning, and the organic residue on the surface of the object to be polished after polishing is also removed. That is, according to the invention, there is provided a means for sufficiently removing organic residues existing on the surface of an object to be polished after polishing.

The mechanism described above is based on speculations, and the right or wrong of the mechanism is not intended to adversely affect the technical scope of the present invention.

In the following description, the various components included in the composition for surface treatment will be explained.

[Water-Soluble Polymer Having Constituent Unit Derived from Glycerin]

The composition for surface treatment according to an embodiment of the present invention includes a water-soluble polymer having a constituent unit derived from glycerin.

A preferred example of the water-soluble polymer having a constituent unit derived from glycerin may be at least one selected from the group consisting of polyglycerin (see the following chemical formula (1)), an ethylene oxide-modified polyglycerin, a sulfonic acid-modified polyglycerin (see, for example, the following chemical formulas (2) and (3)), phosphonic acid-modified polyglycerin (see, for example, the following chemical formulas (4) and (5)), a polyglycerin 4-vinylbenzoic acid ester (styryl group-modified polyglycerin), and a polyglycerin fatty acid ester.

[Chemical Formula 1]

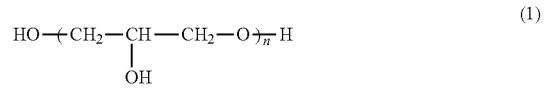

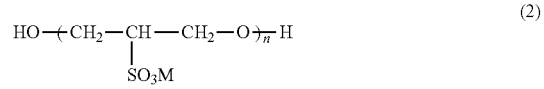

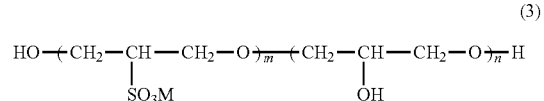

-continued

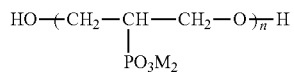

(4)

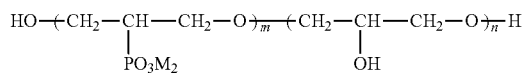

(5)

m and n in the chemical formulas (1) to (5) described above each independently represent the number of a repeating unit, and M in the chemical formulas (2) to (5) described above each independently represent a hydrogen atom, Na, K, or $NH_4^+$.

Meanwhile, a plurality of M's in the chemical formulas (2) to (5) may be identical with each other or may be different from each other. For example, n units of M in chemical formula (2) may all be Na, or may be a combination of two or more of a hydrogen atom, Na, K, and $NH_4^+$. Furthermore, for example, m units of M in chemical formula (3) may all be Na, or may be a combination of two or more of a hydrogen atom, Na, K, and $NH_4^+$.

Examples of the polyglycerin fatty acid ester include a polyglycerin fatty acid (C10-13) ester, a polyglycerin fatty acid (C10) ester, a polyglycerin fatty acid (C8) ester, a polyglycerin fatty acid (C3) ester, decaglycerin laurate (decaglycerin fatty acid (C12) ester), decaglycerin stearate (decaglycerin fatty acid (C18) ester), and decaglycerin oleate (decaglycerin fatty acid (C18) ester).

Among these water-soluble polymers having a constituent unit derived from glycerin, a polyglycerin fatty acid ester is preferred.

Examples of the polyglycerin fatty acid ester include a compound in which the polyglycerin moiety has a straight-chained structure, and a compound in which the polyglycerin moiety has a branched structure, and all of them can be used without limitations. However, a polyglycerin fatty acid ester in which the polyglycerin moiety has a branched structure is preferred. In the case of a branched structure, since a plurality of OH groups in the polyglycerin moiety are three-dimensionally arranged in a more effective manner than in the case of a straight-chained structure, it is thought that the polyglycerin fatty acid ester can adhere more easily to organic residues, the hydrophilic layer on the surface of organic residues also can be formed more easily, and thus, organic residues can be removed more easily.

Furthermore, in regard to the polyglycerin moiety of the polyglycerin fatty acid ester, the number of the constituent unit derived from glycerin is not particularly limited; however, the number of the constituent unit is preferably from 3 to 20, and more preferably from 5 to 15.

Furthermore, the number of carbon atoms in the fatty acid moiety of the polyglycerin fatty acid ester is also not particularly limited; however, the number of carbon atoms is preferably from 2 to 20, more preferably from 6 to 15, and even more preferably from 9 to 14.

The water-soluble polymer having a constituent unit derived from glycerin can be used singly, or two or more kinds thereof can be used in combination.

The content (concentration) of the water-soluble polymer having a constituent unit derived from glycerin (in the case of having two or more kinds of polymers, the total amount) is not particularly limited; however, it is preferable that the content is 0.01 g/kg or more with respect to the total amount of the composition for surface treatment. When the content of the water-soluble polymer having a constituent unit derived from glycerin is 0.01 g/kg or more, the effects of the present invention are further enhanced.

From the same point of view, the content (concentration) of the water-soluble polymer having a constituent unit derived from glycerin is preferably 0.02 g/kg or more, more preferably 0.05 g/kg or more, even more preferably 0.06 g/kg or more, still more preferably 0.08 g/kg or more, particularly preferably 0.1 g/kg or more, and most preferably 0.5 g/kg or more, with respect to the total amount of the composition for surface treatment. It is preferable that the content (concentration) of the water-soluble polymer having a constituent unit derived from glycerin is 5 g/kg or less with respect to the total amount of the composition for surface treatment. When the content (concentration) of the water-soluble polymer having a constituent unit derived from glycerin is 5 g/kg or less, the removal of the water-soluble polymer having a constituent unit derived from glycerin per se after the surface treatment becomes easier. From the same point of view, the content (concentration) of the water-soluble polymer having a constituent unit derived from glycerin is more preferably 4 g/kg or less, more preferably 3 g/kg or less, and particularly preferably 2 g/kg or less, with respect to the total amount of the composition for surface treatment.

The weight average molecular weight of the water-soluble polymer having a constituent unit derived from glycerin is preferably 800 or more. When the weight average molecular weight is 800 or more, the effect of removing foreign materials is further enhanced. This is speculated to be because the coatability of the water-soluble polymer having a constituent unit derived from glycerin at the time of covering the object to be cleaned or a foreign material is further enhanced, and the action of removing the foreign material from the surface of the object to be cleaned or the action of suppressing re-adhesion of the foreign material to the surface of the object to be cleaned is further enhanced. From the same point of view, the weight average molecular weight is more preferably more than 3,000. Furthermore, the upper limit of the weight average molecular weight of the water-soluble polymer having a constituent unit derived from glycerin is not particularly limited; however, the upper limit is preferably 2,000,000 or less, more preferably 1,000,000 or less, and even more preferably 500,000. The weight average molecular weight can be determined by using a gel permeation chromatography (GPC) apparatus and calculating the weight average molecular weight relative to polyethylene glycol standards, and specifically, the weight average molecular weight can be measured by the method described in the Examples.

Regarding the water-soluble polymer having a constituent unit derived from glycerin, a commercially available product may be used, or a synthetic product may be used. The production method in the case of synthesizing the polymer is not particularly limited; and a known polymerization method can be used.

[Acid]

The composition for surface treatment according to an embodiment of the present invention includes an acid. In the present specification, the ionic dispersant described below is considered as a component different from an acid as an additive as used herein. An acid is added mainly for the purpose of adjusting the pH of the composition for surface treatment.

It is speculated that in a case in which the object to be polished after polishing contains silicon nitride, silicon oxide, or polysilicon, an acid has a role of positively charging the surface of the object to be polished after polishing or the surface of a foreign material. Therefore, in the case of using the composition for surface treatment against a foreign material or an object to be cleaned, both of which have a property of being possibly positively charged, the electrostatically repelling effect is further promoted by adding an acid, and the effect of removing foreign materials by the composition for surface treatment is further enhanced.

Regarding the acid, any one of an inorganic acid or an organic acid may be used. The inorganic acid is not particularly limited; however, examples include sulfuric acid, nitric acid, boric acid, carbonic acid, hypophosphorous acid, phosphorous acid, and phosphoric acid. The organic acid is not particularly limited; however, examples include carboxylic acids such as formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid 2-methylhexanoic acid, n-octanoic acid, 2-ethylhexanoic acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid, citric acid, and lactic acid; methanesulfonic acid, ethanesulfonic acid, and isethionic acid.

Among these, from the viewpoint that the effect of positively charging the surface of the object to be polished after polishing and the surface of a foreign material is further improved, and removability of the foreign material is increased, the acid is more preferably maleic acid or nitric acid, and even more preferably maleic acid.

Meanwhile, the acids can be used singly or in combination of two or more kinds thereof.

The content of the acid is preferably 0.01% by mass or more with respect to the total amount of the composition for surface treatment. When the content of the acid is 0.01% by mass or more, the effect of removing foreign materials is further enhanced. This is speculated to be because the effect of positively charging the surface of the object to be polished after polishing and the surface of the foreign materials is further improved. From the same point of view, the content of the acid is preferably 0.02% by mass or more, more preferably 0.03% by mass or more, even more preferably 0.05% by mass or more, and particularly preferably 0.1% by mass or more, with respect to the total amount of the composition for surface treatment. Furthermore, the content of the acid is preferably 5% by mass or less with respect to the total amount of the composition for surface treatment. When the content of the acid is 5% by mass or less, it is preferable from the viewpoint of reducing the cost. From the same point of view, the content of the acid is more preferably 3% by mass or less, and even more preferably 1% by mass or less, with respect to the total amount of the composition for surface treatment.

[Dispersing Medium]

The composition for surface treatment according to an embodiment of the present invention essentially includes water as a dispersing medium (solvent). A dispersing medium has a function of dispersing or dissolving various components. It is more preferable that the dispersing medium is composed of water only. Also, for the dispersion or dissolution of various components, the dispersing medium may be a mixed solvent of water and an organic solvent. In this case, examples of the organic solvent to be used include acetone, acetonitrile, ethanol, methanol, isopropanol, glycerin, ethylene glycol, and propylene glycol, which are organic solvents that are miscible with water. It is also acceptable that these organic solvents are used, without mixing with water, to disperse or dissolve various components, and then the resulting dispersion or solution may be mixed with water. These organic solvents can be used singly or in combination of two or more kinds thereof.

Regarding the water, from the viewpoint of preventing contamination of the object to be cleaned or inhibition of the action of other components, water that does not contain impurities as far as possible is preferred. For example, water having a total content of transition metal ions of 100 ppb or less is preferred. Here, the purity of water can be increased by, for example, operations such as removal of impurity ions using an ion exchange resin, removal of foreign materials using a filter, and distillation. Specifically, regarding the water, it is preferable to use, for example, deionized water (ion-exchanged water), pure water, ultrapure water, or distilled water.

[pH]

The pH of the composition for surface treatment according to an embodiment of the present invention is 5 or lower. When the pH is 5 or lower, in a case in which the composition for surface treatment is used for a foreign material or an object to be cleaned, both of which have a property of being positively chargeable, the surface of the object to be cleaned or the surface of the foreign material can be positively charged more reliably, and as a result of electrostatic repulsion, a superior effect of removing foreign materials is obtained. When the pH of the composition for surface treatment is higher than 5, it is difficult to obtain a foreign material removing effect. This pH is more preferably 4 or lower, even more preferably 3 or lower, still more preferably lower than 3, and particularly preferably 2.5 or lower. Furthermore, the pH of the composition for surface treatment is preferably 1 or higher. When the pH is 1 or higher, the cost can be further reduced.

The pH value of the composition for surface treatment can be checked using a pH meter (manufactured by HORIBA, Ltd., product name: LAQUA (registered trademark)).

When the pH value is adjusted, it is desirable that any component other than the composition for surface treatment according to an embodiment is not added to the composition as far as possible, because such a component may cause generation of a foreign material. Therefore, it is preferable that the composition for surface treatment is produced only from the above-mentioned water-soluble polymer having a constituent unit derived from glycerin, an acid, water, and an ionic dispersant that is added as necessary. However, when it is difficult to obtain a desired pH using these components only, the pH may be adjusted using other additives such as an alkali that can be optionally added, to the extent that the effects of the present invention are not impaired.

[Ionic Dispersant]

It is preferable that the composition for surface treatment according to an embodiment of the present invention further includes an ionic dispersant. An ionic dispersant contributes to the removal of a foreign material by the composition for surface treatment. Therefore, a composition for surface treatment including an ionic dispersant can sufficiently remove foreign materials (impurities including organic residues and the like) remaining on the surface of an object to be polished after polishing during a surface treatment (rinse polishing, cleaning, or the like) of the object to be polished after polishing. Meanwhile, in the present application, the "ionic dispersant" is limited to a compound that does not have a constituent unit derived from glycerin. That is, when this ionic dispersant is a polymer having a constituent unit derived from glycerin, the ionic dispersant should be classified as "a water-soluble polymer having a constituent unit derived from glycerin".

Examples of the ionic dispersant include a polymer compound having a sulfonic acid (salt) group; a polymer compound having a phosphoric acid (salt) group; a polymer compound having a phosphonic acid (salt) group; a polymer compound having a carboxylic acid (salt) group; a water-soluble polymer containing a nitrogen atom, such as polyvinylpyrrolidone (PVP), polyvinylimidazole (PVI), polyvinylcarbazole, polyvinylcaprolactam, polyvinylpiperidine, or polyacryloylmorpholine (PACMO); a polyvinyl alcohol (PVA); and hydroxyethyl cellulose (HEC).

In the present specification, the term "sulfonic acid (salt) group" represents a sulfonic acid group ($-SO_3H$) or a sulfonic acid salt group ($-SO_3M^2$; here, $M^2$ represents an organic or inorganic cation). Similarly, the term "phosphoric acid (salt) group" represents a phosphoric acid group or a phosphoric acid salt group, the term "phosphonic acid (salt) group" represents a phosphonic acid or a phosphonic acid salt group, and the term "carboxylic acid (salt) group" represents a carboxylic acid group or a carboxylic acid salt group.

Among these, a polymer compound having a sulfonic acid (salt) group is preferred. In the following description, a polymer compound having a sulfonic acid (salt) group will be explained.

<Polymer Compound Having Sulfonic Acid (Salt) Group>

In regard to the composition for surface treatment according to an embodiment of the present invention, it is preferable that the ionic dispersant is a polymer compound having a sulfonic acid (salt) group. The polymer compound having a sulfonic acid (salt) group (in the present specification, also simply referred to as "sulfonic acid group-containing polymer") can more easily contribute to the removal of foreign materials by the composition for surface treatment. Therefore, A composition for surface treatment including the sulfonic acid group-containing polymer has an effect that foreign materials (impurities including organic residues) remaining on the surface of an object to be polished after polishing can be more easily removed during a surface treatment (rinse polishing, cleaning, or the like) of the object to be polished after polishing.

This sulfonic acid group-containing polymer can form micelles due to the affinity between the part other than the sulfonic acid (salt) group (that is, the polymer chain part of the sulfonic acid group-containing polymer) and foreign materials (particularly, hydrophobic components). Accordingly, it is conceived that as these micelles are dissolved or dispersed in the composition for surface treatment, foreign materials that are hydrophobic components can also be effectively removed.

Furthermore, under acidic conditions, when the surface of the object to be polished after polishing is cationic, the sulfonic acid (salt) groups become anionic and thereby become easily adsorbable to the surface of the object to be polished after polishing. As a result, it is thought that the surface of the object to be polished after polishing is in a state of being covered with the sulfonic acid group-containing polymer. On the other hand, since the sulfonic acid (salt) groups of the sulfonic acid group-containing polymer are easily adsorbable to the remaining foreign materials (particularly, substances that are prone to be cationic), the surface of the foreign materials is anionically charged. Therefore, the foreign materials whose surface has become anionic, and the anionized sulfonic acid (salt) groups of the sulfonic acid group-containing polymer that has adsorbed to the surface of the object to be polished after polishing, electrostatically repel each other. Furthermore, when the foreign materials are anionic, the foreign materials themselves and the anionized sulfonic acid (salt) groups existing on the object to be polished after polishing, electrostatically repel each other. Therefore, it is thought that foreign materials can be more effectively removed by utilizing such electrostatic repulsion.

Furthermore, it is speculated that in a case in which it is difficult for the object to be polished after polishing to be electrically charged, foreign materials are removed by mechanisms different from the mechanism described above. First, it is thought that on a hydrophobic object to be polished after polishing, foreign materials (particularly, hydrophobic components) are in a state of being easily attachable to the object to be polished after polishing by a hydrophobic interaction. Here, the polymer chain part (hydrophobic structural site) of a sulfonic acid group-containing polymer faces, due to its hydrophobicity, toward the surface side of the object to be polished after polishing, and the anionized sulfonic acid (salt) groups and the like, which are hydrophilic structural sites, face toward a side opposite to the surface side of the object to be polished after polishing. It is speculated that the surface of the object to be polished after polishing is thereby brought into a state of being covered with anionized sulfonic acid (salt) groups and becomes hydrophilic. It is thought that as a result, a hydrophobic interaction between foreign materials (particularly, hydrophobic components) and the object to be polished after polishing does not easily occur, and adhesion of the foreign materials is further suppressed.

The water-soluble polymer having a constituent unit derived from glycerin and the sulfonic acid group-containing polymer, which have adsorbed to the surface of an object to be polished after polishing, are easily removed by further performing washing with water or the like.

The sulfonic acid group-containing polymer is not particularly limited as long as the polymer has a plurality of sulfonic acid (salt) groups, and any known compound can be used. Examples of the sulfonic acid group-containing polymer include a polymer compound obtainable by sulfonating a polymer compound that serves as a base, and a polymer compound obtainable by (co)polymerizing a monomer(s) having a sulfonic acid (salt) group.

More specific examples include a sulfonic acid (salt) group-containing polyvinyl alcohol (sulfonic acid-modified polyvinyl alcohol); a sulfonic acid (salt) group-containing polystyrene such as polystyrenesulfonic acid or sodium polystyrenesulfonate; a sulfonic acid (salt) group-containing polyvinyl acetate (sulfonic acid-modified polyvinyl acetate); a sulfonic acid (salt) group-containing polyester; and a copolymer of a (meth)acrylic group-containing monomer and a sulfonic acid (salt) group-containing monomer, such as a copolymer of (meth)acrylic acid and a sulfonic acid (salt) group-containing monomer. The sulfonic acid group-containing polymers described above can be used singly or in combination of two or more kinds thereof. At least a portion of the sulfonic acid groups carried by these polymers may be in the form of salt. Examples of the salt include alkali metal salts such as sodium salt and potassium salt; salts of Group 2 elements, such as calcium salt and magnesium salt; amine salts; and ammonium salts. Particularly, when the object to be polished after polishing is a semiconductor substrate after a CMP process, an ammonium salt is preferred from the viewpoint of removing metals on the substrate surface as much as possible.

Furthermore, when the sulfonic acid group-containing polymer is a sulfonic acid group-containing polyvinyl alcohol, the degree of saponification is preferably 80% or higher, and preferably 85% or higher (upper limit is 100%), from the viewpoint of solubility.

In the invention, the weight average molecular weight of the sulfonic acid group-containing polymer is preferably 1,000 or more. When the weight average molecular weight is 1,000 or more, the effect of removing foreign materials is further enhanced. This is speculated to be because the coatability of the sulfonic acid group-containing polymer needed at the time of covering an object to be polished after polishing or a foreign material is improved, and the action of removing a foreign material from the surface of an object to be cleaned or the action of suppressing re-adhesion of an organic residue to the surface of an object to be polished after polishing is further enhanced. From the same point of view, the weight average molecular weight is more preferably 2,000 or more, and even more preferably 8,000 or more.

The weight average molecular weight of the sulfonic acid group-containing polymer is preferably 100,000 or less. When the weight average molecular weight is 100,000 or less, the effect of removing foreign materials is further enhanced. This is speculated to be because removability of the sulfonic acid group-containing polymer after a cleaning process is further improved. From the same point of view, the weight average molecular weight is more preferably 50,000 or less, and even more preferably 40,000 or less.

The weight average molecular weight can be measured by gel permeation chromatography (GPC), and specifically, the weight average molecular weight can be measured by the method described in the Examples.

Regarding the sulfonic acid group-containing polymer, a commercially available product may be used, and for example, GOHSENX (registered trademark) L-3226 and GOHSENX (registered trademark) CKS-50 manufactured by Nippon Synthetic Chemical Industry Co., Ltd.; ARON (registered trademark) A-6012, A-6016A, and A-6020 manufactured by TOAGOSEI CO., LTD.; and POLYNASS (registered trademark) PS-1 manufactured by Tosoh Organic Chemical Co., Ltd. can be used.

The content (concentration) of the sulfonic acid group-containing polymer is preferably 0.01 g/kg or more with respect to the total amount of the composition for surface treatment. When the content (concentration) of the sulfonic acid group-containing polymer is 0.01 g/kg or more, the effect of removing foreign materials is further enhanced. This is speculated to be because when the sulfonic acid group-containing polymer covers the object to be polished after polishing and foreign materials, the covering can be achieved in a larger area. Thereby, foreign materials in particular can easily form micelles, and therefore, the effect of removing foreign materials by dissolution or dispersion of the micelles is enhanced. Furthermore, it is speculated to be because an increase in the number of sulfonic acid (salt) groups leads to a stronger manifestation of an electrostatic adsorption or repulsion effect. From the same point of view, the content (concentration) of the sulfonic acid group-containing polymer is preferably 0.03 g/kg or more, and more preferably 0.05 g/kg or more, with respect to the total amount of the composition for surface treatment. Furthermore, it is preferable that the content (concentration) of the sulfonic acid group-containing polymer is 5 g/kg or less with respect to the total amount of the composition for surface treatment. When the content (concentration) of the sulfonic acid group-containing polymer is 5 g/kg or less, the effect of removing foreign materials is further enhanced. This is speculated to be because the removability of the sulfonic acid group-containing polymer itself after a cleaning process is improved. From the same point of view, the content of the sulfonic acid group-containing polymer is more preferably 3 g/kg or less, even more preferably 2 g/kg or less, and particularly preferably 1 g/kg or less, with respect to the total amount of the composition for surface treatment.

According to an embodiment of the present invention, the content of the sulfonic acid group-containing polymer in the ionic dispersant is preferably more than 80% by mass with respect to the total mass of the ionic dispersant (upper limit 100% by mass). When the content of the sulfonic acid group-containing polymer is more than 80% by mass with respect to the total mass of the ionic dispersant included in the composition for surface treatment, the effect of removing foreign materials is further improved. This is because the amount of an ionic dispersant other than the sulfonic acid group-containing polymer, which may cause generation of foreign materials after a cleaning process, can be reduced. Furthermore, it is speculated to be because when the sulfonic acid group-containing polymer covers an object to be polished after polishing and a foreign material, the possibility that the ionic dispersant other than the sulfonic acid group-containing polymer may interrupt the covering by the sulfonic acid group-containing polymer is suppressed. From the same point of view, the content of the sulfonic acid group-containing polymer is more preferably more than 95% by mass with respect to the total mass of the ionic dispersant included in the composition for surface treatment. In such a case, the effect of removing foreign materials is markedly improved.

Furthermore, it is particularly preferable that the content of the sulfonic acid group-containing polymer is 100% by mass with respect to the total mass of the ionic dispersant included in the composition for surface treatment. That is, it is particularly preferable that the ionic dispersant included in the composition for surface treatment is only a sulfonic acid group-containing polymer.

Meanwhile, in the present specification, a "polymer compound" refers to a compound having a weight average molecular weight of 1,000 or more.

[Other Additives]

The composition for surface treatment according to an embodiment of the present invention may also include, if necessary, other additives at any arbitrary proportions to the extent that the effects of the invention are not impaired. However, since components other than the essential components of the composition for surface treatment according to an embodiment of the present invention may cause generation of foreign materials, it is desirable that those additives are not added as far as possible. Therefore, it is preferable that regarding the components other than the essential components, the amounts of addition thereof are as small as possible, and it is more preferable that those components are not incorporated. Examples of the other additives include abrasive grains, an alkali, an antiseptic agent, dissolved gas, a reducing agent, an oxidizing agent, and an alkanolamine. Among them, for further improvement of the foreign material removing effect, it is preferable that the composition for surface treatment substantially does not include abrasive grains. Here, the phrase "substantially does not include abrasive grains" means that the content of abrasive grains with respect to the total amount of the composition for surface treatment is 0.01% by mass or less.

[Foreign Material Removing Effect]

The composition for surface treatment according to an embodiment of the present invention is such that it is more preferable as the effect of removing foreign materials (organic residues) on the surface of the object to be polished after polishing is higher. That is, when a surface treatment of an object to be polished after polishing is performed using the composition for surface treatment, it is more preferable as the number of foreign materials (organic residues) remaining on the surface is smaller. Specifically, when an object to be polished after polishing is surface-treated using the composition for surface treatment, it is preferable that the number of foreign materials (organic residues) is 6,000 or less, more preferably 3,000 or less, even more preferably 2,000 or less, particularly preferably 1,500 or less, and most preferably 1,000 or less. Meanwhile, since it is more preferable as the number of the foreign materials (organic residues) is smaller, the lower limit is not particularly limited; however, the lower limit is substantially 50.

Meanwhile, regarding the number of the foreign materials (organic residues), the value obtained by performing a surface treatment by the method described in the Examples and then making a measurement by the method described in the Examples is employed.

[Method for Producing Composition for Surface Treatment]

The method for producing the composition for surface treatment is not particularly limited. For example, the composition for surface treatment can be produced by mixing a water-soluble polymer having a constituent unit derived from glycerin, an acid, and water. That is, according to another embodiment of the present invention, there is also provided a method for producing the composition for surface treatment, the method including mixing a water-soluble polymer having a constituent unit derived from glycerin, with an acid and water. The type, amount of addition, and the like of the water-soluble polymer having a constituent unit derived from glycerin are as described above. Furthermore, in regard to the method for producing a composition for surface treatment according to an embodiment of the present invention, if necessary, the above-mentioned ionic dispersant, other additives, a dispersing medium other than water, and the like may be further mixed into the composition for surface treatment as necessary. The types, amounts of addition, and the like of these components are as described above.

There are no particular limitations on the order of addition and the method of addition of the various components described above. The respective components may be added all at once or separately, stepwise or continuously. The mixing method is also not particularly limited, and any known method can be used. Preferably, the method for producing a composition for surface treatment includes sequentially adding a water-soluble polymer having a constituent unit derived from glycerin, an acid, water, and an ionic dispersant that is added as necessary, and stirring the mixture in water. In addition, the method for producing a composition for surface treatment may further include measuring the pH of the composition for surface treatment and adjusting the pH to a value of 5 or lower.

[Surface Treatment Method]

Another embodiment of the present invention is a surface treatment method including surface-treating an object to be polished after polishing, by using the composition for surface treatment described above. In the present specification, a surface treatment method refers to a method of reducing foreign materials on the surface of an object to be polished after polishing, and this method is a method of performing cleaning in a broad sense.

When the surface treatment method according to an embodiment of the present invention is used, foreign materials remaining on the surface of an object to be polished after polishing can be sufficiently removed. That is, according to another embodiment of the present invention, there is provided a method for reducing foreign materials on the surface of an object to be polished after polishing, the method including surface-treating the object to be polished after polishing by using the composition for surface treatment described above.

The surface treatment method according to an embodiment of the present invention is carried out by a method of bringing the composition for surface treatment according to the invention into direct contact with an object to be polished after polishing.

Regarding the surface treatment method, mainly (I) a method based on a rinse polishing treatment, and (II) a method based on a cleaning treatment may be mentioned. That is, it is preferable that the surface treatment according to an embodiment of the present invention is carried out by rinse polishing or cleaning. The rinse polishing treatment and the cleaning treatment are carried out in order to obtain a clean surface by removing foreign materials (particles, metal contaminants, organic residues, pad wastes, and the like) on the surface of an object to be polished after polishing. The above-described items (I) and (II) will be explained below.

(I) Rinse Polishing Treatment

The composition for surface treatment according to the invention is suitably used for a rinse polishing treatment. The rinse polishing treatment is carried out on a polishing table (platen) equipped with a polishing pad after the object to be polished is subjected to final polishing (finish polishing), for the purpose of removing foreign materials on the surface of the object to be polished. At this time, the rinse polishing treatment is carried out by bringing the composition for surface treatment according to the invention into direct contact with the object to be polished after polishing. As a result, the foreign materials on the surface of the object to be polished after polishing are removed by the frictional force (physical action) exerted by the polishing pad and the chemical action caused by the composition for surface treatment. Among the foreign materials, particles and organic residues in particular are easily removed by physical action. Therefore, in the rinse polishing treatment, the particles or organic residues can be effectively removed by utilizing the friction between the object to be polished after polishing and a polishing pad on a polishing table (platen).

Specifically, the rinse polishing treatment can be carried out by positioning the surface of an object to be polished after polishing obtained after a polishing process on the polishing table (platen) of a polishing apparatus, bringing the object to be polished after polishing into contact with a polishing pad, and causing the object to be polished after polishing and the polishing pad to slide relative to each other, while supplying a composition for surface treatment (composition for rinse polishing) to the contact portion.

The rinse polishing treatment can also be carried out by using any one of a single-sided polishing apparatus and a both-sided polishing apparatus. Furthermore, it is preferable that the polishing apparatus includes a discharge nozzle for a composition for rinse polishing, in addition to a discharge nozzle for a polishing composition. The operating conditions for the polishing apparatus at the time of the rinse polishing treatment are not particularly limited, and any person having ordinary skill can set the conditions as appropriate.

(II) Cleaning Treatment

The composition for surface treatment according to the invention is suitably used for a cleaning treatment. The cleaning treatment is carried out, after the object to be polished is subjected to final polishing (finish polishing), or after the rinse polishing treatment is performed, for the purpose of removing foreign materials on the surface of the object to be polished. Meanwhile, the cleaning treatment and the rinse polishing treatment are classified by the place where these treatments are carried out, and the cleaning treatment is a surface treatment that is carried out after an object to be polished after polishing is dismounted from the polishing table (platen). In the cleaning treatment, too, the composition for surface treatment according to the invention can be brought into direct contact with an object to be polished after polishing, and foreign materials on the surface of the object can be removed.

Examples of the method of performing a cleaning treatment include (i) a method of bringing a cleaning brush into contact with one surface or both surfaces of an object to be polished after polishing while the object to be polished after polishing is retained, and rubbing the surface of the object to be cleaned with the cleaning brush while a composition for surface treatment is supplied to the contact portion; and (ii) a method of immersing an object to be polished after polishing into a composition for surface treatment, and performing an ultrasonic treatment or stirring (dipping type). In such methods, foreign materials on the surface of the object to be polished are removed by a frictional force caused by the cleaning brush or a mechanical force generated by an ultrasonic treatment or stirring, and a chemical action caused by the composition for surface treatment.

In the method (i) described above, the method of bringing the composition for surface treatment (cleaning composition) into contact with an object to be polished after polishing is not particularly limited; however, the contacting method may be a spinning method of rotating the object to be polished after polishing at a high speed while causing the composition for surface treatment to flow over the object to be polished after polishing from a nozzle; and a spraying method of cleaning by spraying the composition for surface treatment toward the object to be polished after polishing.

From the viewpoint that more efficient removal of contaminants in a short time period can be achieved, it is preferable to employ a spinning method or a spraying method, and more preferably a spinning method, for the cleaning treatment.

Examples of an apparatus for performing such a cleaning treatment include a batch type cleaning apparatus that performs simultaneous surface treatments on a plurality of sheets of polished objects to be polished, which are accommodated in a cassette; and a sheet type cleaning apparatus in which one sheet of an object to be polished after polishing is mounted on a holder and is surface-treated. From the viewpoint of shortening the cleaning time or the like, a method of using a sheet type cleaning apparatus is preferred.

Furthermore, as an apparatus for performing a cleaning treatment, a polishing apparatus including a cleaning facility that detaches the object to be polished after polishing from the polishing table (platen) and then rubs the object to be polished after polishing with a cleaning brush, may be used. When such a polishing apparatus is used, the cleaning treatment of the object to be polished after polishing can be carried out more efficiently.

Regarding such a polishing apparatus, a general polishing apparatus having a holder that retains an object to be polished after polishing, a motor capable of operating at a variable speed of rotation, a cleaning brush, and the like can be used. Regarding the polishing apparatus, any one of a single-sided polishing apparatus or a double-sided polishing apparatus may be used. In addition, in the case of performing a rinse polishing process after a CMP process, it is more efficient and preferable that this cleaning treatment is carried out using an apparatus similar to the polishing apparatus used in the rinse polishing apparatus.

The cleaning brush is not particularly limited; however, preferably, a brush made of a resin is used. The material for the brush made of a resin is not particularly limited; however, for example, polyvinyl alcohol (PVA) may be used. Regarding the cleaning brush, it is more preferable to use a sponge made of PVA.

There are no particular limitations on the cleaning conditions, and the cleaning conditions can be set as appropriate according to the type of the object to be cleaned, and the type and amount of the organic residue as an object to be removed. For example, the speed of rotation of the cleaning brush is preferably from 10 rpm (0.17 $s^{-1}$; 60 rpm=1 $s^{-1}$, hereinafter, the same) to 200 rpm (3.3 $s^{-1}$). The speed of rotation of the object to be cleaned is preferably from 10 rpm (0.17 $s^{-1}$) to 100 rpm (1.7 $s^{-1}$). The pressure applied to the object to be cleaned (polishing pressure) is preferably from 0.5 psi (3.4 kPa; 1 psi=6894.76 Pa, hereinafter, the same) to 10 psi (68.9 kPa). The method of supplying the composition for surface treatment to the cleaning brush is also not particularly limited, and for example, a method of continuously supplying the composition for surface treatment using a pump or the like (constant flow) is employed. The amount of supply of the composition for surface treatment is not particularly limited; however, the amount of supply is preferably an amount supply that allows the surfaces of the cleaning brush and the object to be cleaned to be constantly covered with the composition for surface treatment, and the amount of supply is more preferably from 10 mL/min to 5,000 mL/min. The cleaning time is not particularly limited; however, in the process of using the composition for surface treatment according to an embodiment of the present invention, the cleaning time is preferably from 5 seconds to 180 seconds. When the amount of supply of the composition for surface treatment is in such a range, foreign materials can be removed more effectively.

The temperature of the composition for surface treatment at the time of cleaning is not particularly limited, and usually, the cleaning temperature is desirably room temperature (25° C.). However, the composition for surface treatment may be warmed to a temperature of about from 40° C. to 70° C., to the extent that the performance is not impaired.

In the method (ii) described above, there are no particular limitations on the conditions for the cleaning method based on immersion, and any known technique can be used.

Before, after, or both before and after performing the cleaning treatment according to the method (i) or (ii) described above, it is also acceptable to perform cleaning with water.

Furthermore, it is preferable that the object to be polished after polishing (object to be cleaned) after cleaning is dried by shaking off the water droplets adhering to the surface by means of a spin dryer or the like. The surface of the object to be cleaned may also be dried by air blow drying.

[Method for Producing Semiconductor Substrate]

The surface treatment method according to an embodiment of the present invention can be suitably applied when the object to be polished after polishing is a polished semiconductor substrate. That is, according to another embodiment of the present invention, there is also provided a method for producing a semiconductor substrate, in which the object to be polished after polishing is a polished semiconductor substrate, and this polished semiconductor substrate is surface-treated using the composition for surface treatment.

The details of the semiconductor substrate to which such a production method is applied are as explained above for the object to be polished after polishing that is surface-treated using the composition for surface treatment described above.

Regarding the method for producing a semiconductor substrate, there are no particular limitations as long as the method includes a process of surface-treating the surface of a polished semiconductor substrate using the composition for surface treatment according to an embodiment of the present invention (surface treatment process). Examples of such a production method include a method including a polishing process and a cleaning process for forming a polished semiconductor substrate. Furthermore, as another example, a method including, in addition to the polishing process and the cleaning process, a rinse polishing process between the polishing process and the cleaning process may be mentioned. In the following description, these various processes will be explained.

<Polishing Process>

The polishing process that may be included in the method for producing a semiconductor substrate is a process of forming a polished semiconductor substrate by polishing a semiconductor substrate.

The polishing process is not particularly limited as long as it is a process of polishing a semiconductor substrate; however, the polishing process is preferably a chemical mechanical polishing (CMP) process. Furthermore, the polishing process may be a polishing process composed of a single process, or may be a polishing process including a plurality of processes. Examples of the polishing process that includes a plurality of processes include a process of performing a finish polishing process after a preliminary polishing process (crude polishing process); and a process of performing one time or two or more times of secondary polishing processes after a primary polishing process, and then performing a finish polishing process. It is preferable that the surface treatment process of using the composition for surface treatment according to the invention is carried out after the finish polishing process.

Regarding the polishing composition, a known polishing composition can be used as appropriate in accordance with the characteristics of the semiconductor substrate. The polishing composition is not particularly limited; however, for example, a polishing composition including abrasive grains, an acid salt, a dispersing medium, and an acid can be preferably used. Specific examples of such a polishing composition include a polishing composition including sulfonic acid-modified colloidal silica, water, and maleic acid.

Regarding the polishing apparatus, a general polishing apparatus which is equipped with a holder for retaining an object to be polished, a motor capable of operating at a variable speed of rotation and the like, and has a polishing table capable of attaching a polishing pad (polishing cloth), can be used. Regarding the polishing apparatus, any one of a single-sided polishing apparatus or a double-sided polishing apparatus may be used.

Regarding the polishing pad, a general nonwoven fabric, a polyurethane, a porous fluororesin, and the like can be used without any particular limitations. It is preferable that the polishing pad is subjected to grooving for collecting the polishing liquid.

The polishing conditions are not particularly limited, and for example, the speed of rotation of the polishing table and the speed of rotation of the head (carrier) are preferably from 10 rpm to 100 rpm, and the pressure applied to the object to be polished (polishing pressure) is preferably from 0.5 psi (3.4 kPa) to 10 psi (68.9 kPa). The method for supplying the polishing composition to the polishing pad is also not particularly limited, and for example, a method of continuously supplying the polishing composition with a pump or the like (constant flow) is employed. The amount of supply of the polishing composition is not particularly limited; however, an amount of supply by which the surface of the polishing pad is constantly covered with the polishing composition is preferred, and it is more preferable that the amount of supply is from 10 mL/min to 5,000 mL/min. The polishing time is also not particularly limited; however, in a process of using a polishing composition, the polishing time is preferably from 5 seconds to 180 seconds.

<Surface Treatment Process>

The surface treatment process refers to a process of reducing foreign materials on the surface of an object to be polished after polishing by using the composition for surface treatment according to the invention. In the method for producing a semiconductor substrate, a rinse polishing process and a cleaning process may be carried out as surface treatment processes, only a rinse polishing process may be carried out, or only a cleaning process may be carried out.

(Rinse Polishing Process)

The rinse polishing process may be provided between a polishing process and a cleaning process in the method for producing a semiconductor substrate. The rinse polishing process is a process of reducing foreign materials on the surface of an object to be polished after polishing (polished semiconductor substrate), by the surface treatment method (rinse polishing treatment method) according to an embodiment of the present invention.

In the rinse polishing process, regarding the polishing apparatus, polishing pad, conditions for rinse polishing, and the like, apparatuses and conditions similar to the polishing process described above can be applied, except that the composition for surface treatment according to the invention is supplied instead of supplying a polishing composition.

The details of the rinse polishing method used in the rinse polishing process are as described above in the explanation related to the rinse polishing treatment described above.

(Cleaning Process)

The cleaning process may be provided after the polishing process, or may be provided after the rinse polishing process, in the method for producing a semiconductor substrate. The cleaning process is a process of reducing foreign materials on the surface of an object to be polished after polishing (polished semiconductor substrate) by the surface treatment method (cleaning method) according to an embodiment of the present invention.

The details of the cleaning method used in the cleaning process are as described in the explanation related to the cleaning method described above.

Embodiments of the present invention have been described in detail; however, these are only for illustrative purpose and are not limited. It is obvious that the scope of the invention should be definitely construed based on the claims.

The present invention includes the following embodiments.

1. A composition for surface treatment used for treating the surface of an object to be polished after polishing,
   the composition for surface treatment including:
   a water-soluble polymer having a constituent unit derived from glycerin;
   an acid; and
   water,
   the composition for surface treatment having a pH of 5 or lower;
2. The composition for surface treatment described in item 1., in which the water-soluble polymer having a constituent unit derived from glycerin is at least one selected from the group consisting of polyglycerin, an ethylene oxide-modified polyglycerin, a sulfonic acid-modified polyglycerin, a phosphonic acid-modified polyglycerin, a polyglycerin 4-vinylbenzoic acid ester, and a polyglycerin fatty acid ester;
3. The composition for surface treatment described in item 1. or 2., further including an ionic dispersant;
4. The composition for surface treatment described in item 3., in which the ionic dispersant is a polymer compound having a sulfonic acid (salt) group;
5. The composition for surface treatment described in anyone of items 1. to 4., in which the composition for surface treatment has a pH of 4 or lower;
6. The composition for surface treatment described in anyone of items 1. to 5., in which the composition for surface treatment substantially does not include abrasive grains;
7. The composition for surface treatment described in anyone of items 1. to 6., in which the object to be polished after polishing contains polysilicon;
8. A method for producing the composition for surface treatment described in any one of items 1. to 7., the method including mixing the water-soluble polymer having a constituent unit derived from glycerin, the acid, and the water;
9. A surface treatment method, including performing a surface treatment of an object to be polished after polishing using the composition for surface treatment described in any one of items 1. to 7., and thereby reducing organic residues on the surface of the object to be polished after polishing;
10. The surface treatment method described in item 9., in which the surface treatment is carried out by rinse polishing or cleaning; and
11. A method for producing a semiconductor substrate, the method including a surface treatment process of reducing organic residues on the surface of an object to be polished after polishing, by the surface treatment method described in item 9. or 10.
   in which the object to be polished after polishing is a polished semiconductor substrate.

EXAMPLES

The present invention will be described in greater detail using the following Examples and Comparative Examples. However, the technical scope of the present invention is not intended to be limited to the following Examples only. Unless particularly stated otherwise, the units "percent (%)" and "parts" mean "mass %" and "parts by mass", respectively. In the following Examples, unless particularly stated otherwise, operations were carried out under the conditions of room temperature (from 20° C. to 25° C.)/a relative humidity of from 40% RH to 50% RH.

Meanwhile, regarding the weight average molecular weight of the water-soluble polymer having a constituent unit derived from glycerin and the weight average molecular weight of polyvinyl alcohol, values of the weight average molecular weight measured by gel permeation chromatograph (GPC) (calculated relative to polyethylene glycol standards) were used, and more specifically, the weight average molecular weights were measured using the following apparatuses and conditions.

GPC apparatus: manufactured by SHIMADZU CORPORATION
Type: Prominence
Column: Shim-pack (Registered trademark) VP-ODS (manufactured by Shimadzu GLC, Ltd.)
Mobile phase A: MeOH
B: 1% aqueous solution of acetic acid
Flow rate: 1 mL/min
Detector: ELSD (Evaporative Light Scattering Detector), (ELSD-LTII) temp. 40° C., Gain 8, $N_2$GAS 350 kPa
Oven temperature: 40° C.
Injection amount: 40 μL.

<Production of Composition for Surface Treatment>

Example 1: Production of Composition for Surface Treatment A-1

Composition for surface treatment A-1 was produced by mixing the following components with water (deionized water): an aqueous solution of maleic acid at a concentration of 30% by mass as an organic acid in an amount of 1.0 part by mass (0.3 parts by mass in terms of maleic acid) with respect to 100 parts by mass of the total amount of the composition, a polyglycerin (weight average molecular weight (Mw): 15,000) as a water-soluble polymer having a constituent unit derived from glycerin to a concentration of 1.0 g/kg, and polystyrenesulfonic acid as an ionic dispersant to a concentration of 0.25 g/kg. In regard to the composition for surface treatment A-1 (liquid temperature: 25° C.), the pH checked by using a pH meter (manufactured by HORIBA, Ltd., product name: LAQUA (registered trademark)) was 2.1.

Example 2: Production of Composition for Surface Treatment A-2

Composition for surface treatment A-2 was produced in the same manner as in Example 1, except that an ethylene oxide-modified polyglycerin (EO-modified polyglycerin, weight average molecular weight: 15,000) was used instead of the polyglycerin. In regard to the composition for surface treatment A-2 (liquid temperature: 25° C.), the pH checked by a method similar to that of Example 1 was 2.1.

Example 3: Production of Composition for Surface Treatment A-3

Composition for surface treatment A-3 was produced in the same manner as in Example 2, except that the concentration of the ethylene oxide-modified polyglycerin (EO-modified polyglycerin, weight average molecular weight: 15,000) was changed to 2.0 g/kg. In regard to the composition for surface treatment A-3 (liquid temperature: 25° C.), the pH checked by a method similar to that of Example 1 was 2.1.

Example 4: Production of Composition for Surface Treatment A-4

Composition for surface treatment A-4 was produced in the same manner as in Example 1, except that a sulfonic acid-modified polyglycerin (weight average molecular weight: 10,000 to 15,000) was used instead of polyglycerin. In regard to the composition for surface treatment A-4 (liquid temperature: 25° C.), the pH checked by a method similar to that of Example 1 was 2.1.

Example 5: Production of Composition for Surface Treatment A-5

Composition for surface treatment A-5 was produced in the same manner as in Example 4, except that the concentration of the sulfonic acid-modified polyglycerin (weight average molecular weight: 10,000 to 15,000) was changed to 2.0 g/kg. In regard to the composition for surface treatment A-5 (liquid temperature: 25° C.), the pH checked by a method similar to that of Example 1 was 2.1.

Example 6: Production of Composition for Surface Treatment A-6

Composition for surface treatment A-6 was produced in the same manner as in Example 1, except that a phosphonic acid-modified polyglycerin (weight average molecular weight: 10,000 to 15,000) was used instead of polyglycerin. In regard to the composition for surface treatment A-6 (liquid temperature: 25° C.), the pH checked by a method similar to that of Example 1 was 2.1.

Example 7: Production of Composition for Surface Treatment A-7

Composition for surface treatment A-7 was produced in the same manner as in Example 6, except that the concentration of the phosphonic acid-modified polyglycerin (weight average molecular weight: 10,000 to 15,000) was changed to 2.0 g/kg. In regard to the composition for surface treatment A-7 (liquid temperature: 25° C.), the pH checked by a method similar to that of Example 1 was 2.1.

Example 8: Production of Composition for Surface Treatment A-8

Composition for surface treatment A-8 was produced in the same manner as in Example 1, except that a polyglycerin 4-vinylbenzoic acid ester (weight average molecular weight: 10,000 to 15,000) was used instead of polyglycerin. In regard to the composition for surface treatment A-8 (liquid temperature: 25° C.), the pH checked by a method similar to that of Example 1 was 2.1.

Example 9: Production of Composition for Surface Treatment A-9

Composition for surface treatment A-9 was produced in the same manner as in Example 1, except that a polyglycerin fatty acid (C10-13) ester (weight average molecular weight: 1,000) was used instead of polyglycerin. In regard to the composition for surface treatment A-8 (liquid temperature: 25° C.), the pH checked by a method similar to that of Example 1 was 2.1.

Example 10: Production of Composition for Surface Treatment A-10

Composition for surface treatment A-10 was produced in the same manner as in Example 1, except that a polyglycerin fatty acid (C10) ester (weight average molecular weight: 900) was used instead of polyglycerin. In regard to the composition for surface treatment A-10 (liquid temperature: 25° C.), the pH checked by a method similar to that of Example 1 was 2.1.

Example 11: Production of Composition for Surface Treatment A-11

Composition for surface treatment A-11 was produced in the same manner as in Example 1, except that a polyglycerin fatty acid (C8) ester (weight average molecular weight: 900) was used instead of polyglycerin. In regard to the composition for surface treatment A-11 (liquid temperature: 25° C.), the pH checked by a method similar to that of Example 1 was 2.1.

Example 12: Production of Composition for Surface Treatment A-12

Composition for surface treatment A-12 was produced in the same manner as in Example 1, except that a polyglycerin fatty acid (C3) ester (weight average molecular weight: 800) was used instead of polyglycerin. In regard to the composition for surface treatment A-12 (liquid temperature: 25° C.), the pH checked by a method similar to that of Example 1 was 2.1.

Example 13: Production of Composition for Surface Treatment A-13

Composition for surface treatment A-13 was produced in the same manner as in Example 1, except that decaglycerin laurate (weight average molecular weight: 1,000) was used instead of polyglycerin. In regard to the composition for surface treatment A-13 (liquid temperature: 25° C.), the pH checked by a method similar to that of Example 1 was 2.1.

Example 14: Production of Composition for Surface Treatment A-14

Composition for surface treatment A-14 was produced in the same manner as in Example 1, except that decaglycerin stearate (weight average molecular weight: 1,000) was used instead of polyglycerin. In regard to the composition for surface treatment A-14 (liquid temperature: 25° C.), the pH checked by a method similar to that of Example 1 was 2.1.

Example 15: Production of Composition for Surface Treatment A-15

Composition for surface treatment A-15 was produced in the same manner as in Example 1, except that decaglycerin oleate (weight average molecular weight: 1,000) was used instead of polyglycerin. In regard to the composition for surface treatment A-15 (liquid temperature: 25° C.), the pH checked by a method similar to that of Example 1 was 2.1.

Comparative Example 1: Production of Composition for Surface Treatment C-1

Composition for surface treatment C-1 was produced in the same manner as in Example 1, except that polyglycerin was not used. In regard to the composition for surface treatment C-1 (liquid temperature: 25° C.), the pH checked by a method similar to that of Example 1 was 2.1.

Comparative Example 2: Production of Composition for Surface Treatment C-2

Composition for surface treatment C-2 was produced in the same manner as in Example 1, except that a polyvinyl alcohol (weight average molecular weight: 15,000) was used instead of polyglycerin. In regard to the composition for surface treatment C-2 (liquid temperature: 25° C.), the pH checked by a method similar to that of Example 1 was 2.1.

<Evaluation>
<Preparation of Object to be Polished after Polishing (Object to be Subjected to Surface Treatment)>

A polished silicon nitride substrate, a polished TEOS substrate, and a polished polysilicon substrate, all of which had been polished by a chemical mechanical polishing (CMP) process as described below, or a polished silicon nitride substrate, a polished TEOS substrate, and a polished polysilicon substrate, all of which had been further treated as necessary by a rinse polishing process as described below, were prepared as objects to be subjected to surface treatment.

[CMP Process]

A silicon nitride substrate, a TEOS substrate, and a polysilicon substrate, all being semiconductor substrates, were respectively subjected to polishing under the conditions described below using a polishing composition (composition: 4% by mass of sulfonic acid-modified colloidal silica (produced by the method described in "Sulfonic acid-functionalized silica through quantitative oxidation of thiol groups", Chem. Commun., 246-247 (2003), primary particle size 30 nm, and secondary particle size 60 nm), 0.018% by mass of an aqueous solution of maleic acid at a concentration of 30% by mass, solvent: water). Here, for the silicon nitride substrate, TEOS substrate, and polysilicon substrate, 200-mm wafers were used.

(Polishing Apparatus and Polishing Conditions)
Polishing apparatus: MirraMesa manufactured by Applied Materials, Inc.
Polishing pad: Hard polyurethane pad IC1010 manufactured by Nitta Haas, Inc.
Polishing pressure: 2.0 psi (13.8 kPa) (1 psi=6894.76 Pa; hereinafter, the same)
Speed of rotation of polishing table: 60 rpm
Speed of rotation of head: 60 rpm
Supply of polishing composition: Constant flow
Amount of supply of polishing composition: 100 mL/min
Polishing time: 60 seconds

[Rinse Polishing Process]

According to necessity, the polished silicon nitride substrate, polished TEOS substrate, and polished polysilicon substrate obtained after polishing by the CMP process described above were subjected to rinse polishing under the conditions described below, using a composition for rinse polishing (composition: 0.1% by mass of a polyvinyl alcohol (weight average molecular weight: 10,000), solvent: water, adjusted to pH=2 with nitric acid).

(Rinse Polishing Apparatus and Rinse Polishing Conditions)
Polishing apparatus: MirraMesa manufactured by Applied Materials, Inc.
Polishing pad: Hard polyurethane pad IC1010 manufactured by Nitta Haas, Inc.
Polishing pressure: 1.0 psi (6.89 kPa)
Speed of rotation of polishing table: 60 rpm
Speed of rotation of head: 60 rpm
Supply of composition for rinse polishing: Constant flow
Amount of supply of composition for rinse polishing: 100 mL/min
Polishing time: 60 seconds

[Cleaning Process]

Each of the polished objects to be polished was cleaned by a cleaning method of rubbing each of the polished objects to be polished under the conditions described below, while pressure was applied to the object to be polished after polishing with a sponge made of polyvinyl alcohol (PVA) as a cleaning brush, using each of the composition for surface treatments produced as described above or water (deionized water).

(Cleaning Apparatus and Cleaning Conditions)
Apparatus: MirraMesa manufactured by Applied Materials, Inc.
Speed of rotation of cleaning brush: 100 rpm
Speed of rotation of object to be cleaned (object to be polished after polishing): 50 rpm
Flow rate of cleaning liquid: 1,000 mL/min
Cleaning time: 60 seconds <Evaluation>

For each of the polished objects to be polished obtained after the cleaning process described above, measurements were made for the following items, and evaluations were performed. The evaluation results are collectively shown in Table 1.

[Evaluation of Total Number of Defects]

The total number of defects having a size of 0.13 μm or more was measured for the polished objects to be polished obtained after performing the cleaning process described above. For the measurement of the total number of defects, Surfscan SP2 manufactured by KLA-Tencor Corp. was used. The measurement was performed for the area on one surface of the polished objects to be polished, remaining after excluding those areas extending over a width of 5 mm from the outer circumferential edges.

[Evaluation of Number of Organic Residues]

For the polished objects to be polished obtained after performing the cleaning treatment described above, the number of organic residues was measured by SEM observation using Review SEM RS6000 manufactured by Hitachi High-Technologies Corp. First, one hundred defects existing in the area on one surface of an object to be polished after polishing, remaining after excluding those areas extending over a width of 5 mm from the outer circumferential edges, were sampled by SEM observation. Next, among the one hundred defects thus sampled, organic residues were distinguished by a SEM observation by visual inspection, and the number of the organic residues was checked. Thus, the proportion (%) of organic residues among the defects was calculated. Then, the product of the total number of defects (pieces) having a size of 0.13 μm or more as measured by the evaluation of the total number of defects as described above and the proportion (%) of organic residues among the defects calculated by SEM observation, was calculated as the number (pieces) of organic residues.

For each of the composition for surface treatments, the evaluation results for the organic residues in the case of using a polished silicon nitride substrate, a polished TEOS substrate or a polished polysilicon substrate as an object to be subjected to surface treatment, are respectively shown in the following Table 1.

TABLE 1

| Composition for surface treatment No. | Water-soluble polymer | | |
|---|---|---|---|
| | Type | Weight average molecular weight | Structure of polyglycerin part |
| Example 1 | A-1 | Polyglycerin | 15000 | Straight-chained |
| Example 2 | A-2 | EO-modified polyglycerin | 15000 | Straight-chained |
| Example 3 | A-3 | EO-modified polyglycerin | 15000 | Straight-chained |
| Example 4 | A-4 | Sulfonic acid-modified polyglycerin | 10000-15000 | Straight-chained |
| Example 5 | A-5 | Sulfonic acid-modified polyglycerin | 10000-15000 | Straight-chained |
| Example 6 | A-6 | Phosphonic acid-modified polyglycerin | 10000-15000 | Straight-chained |
| Example 7 | A-7 | Phosphonic acid-modified polyglycerin | 10000-15000 | Straight-chained |
| Example 8 | A-8 | Polyglycerin 4-vinylbenzoic acid ester | 10000-15000 | Straight-chained |
| Example 9 | A-9 | Polyglycerin fatty acid (C10-13) ester | 1000 | Branched |
| Example 10 | A-10 | Polyglycerin fatty acid (C10) ester | 900 | Branched |
| Example 11 | A-11 | Polyglycerin fatty acid (C8) ester | 900 | Branched |
| Example 12 | A-12 | Polyglycerin fatty acid (C3) ester | 800 | Branched |
| Example 13 | A-13 | Decaglycerin laurate | 1000 | Branched |
| Example 14 | A-14 | Decaglycerin stearate | 1000 | Branched |
| Example 15 | A-15 | Decaglycerin oleate | 1000 | Branched |
| Comparative Example 1 | C-1 | None | — | — |
| Comparative Example 2 | C-2 | Polyvinyl alcohol | 1000 | — |

| | Water-soluble polymer Concentration (g/kg) | Ionic dispersant Concentration (g/kg) | Acid | Number of organic residues (pieces) | | |
|---|---|---|---|---|---|---|
| | | | | SiN | TEOS | Poly-SI |
| Example 1 | 1.0 | 0.25 | Maleic acid | 345 | 2201 | 809 |
| Example 2 | 1.0 | 0.25 | Maleic acid | 325 | 998 | 727 |
| Example 3 | 2.0 | 0.25 | Maleic acid | 412 | 891 | 411 |
| Example 4 | 1.0 | 0.25 | Maleic acid | 304 | 873 | 562 |
| Example 5 | 2.0 | 0.25 | Maleic acid | 111 | 888 | 432 |
| Example 6 | 1.0 | 0.25 | Maleic acid | 101 | 907 | 446 |
| Example 7 | 2.0 | 0.25 | Maleic acid | 121 | 894 | 502 |
| Example 8 | 1.0 | 0.25 | Maleic acid | 132 | 734 | 398 |
| Example 9 | 1.0 | 0.25 | Maleic acid | 98 | 801 | 201 |
| Example 10 | 1.0 | 0.25 | Maleic acid | 78 | 742 | 234 |
| Example 11 | 1.0 | 0.25 | Maleic acid | 84 | 814 | 452 |
| Example 12 | 1.0 | 0.25 | Maleic acid | 86 | 672 | 582 |
| Example 13 | 1.0 | 0.25 | Maleic acid | 79 | 845 | 238 |
| Example 14 | 1.0 | 0.25 | Maleic acid | 82 | 901 | 611 |
| Example 15 | 1.0 | 0.25 | Maleic acid | 88 | 720 | 712 |
| Comparative Example 1 | — | 0.25 | Maleic acid | 335 | 5555 | 11234 |
| Comparative Example 2 | 1.0 | 0.25 | Maleic acid | 321 | 3321 | 3121 |

As is obvious from Table 1, it was found that the composition for surface treatments of the Examples can reduce organic residues on the surface of polished objects to be polished, compared to the composition for surface treatments of the Comparative Examples.

The present patent application is based on Japanese Patent Application No. 2017-182903, filed on Sep. 22, 2017 and Japanese Patent Application No. 2018-046471, filed on Mar. 14, 2018, the entire disclosure of which is incorporated herein by reference.

What is claimed is:

1. A composition for surface treatment used for treating the surface of an object to be polished after polishing, the composition for surface treatment comprising:
   a water-soluble polymer having a constituent unit derived from glycerin;
   an acid; and
   water,
   wherein the composition for surface treatment has a pH of 3 or lower, and the water-soluble polymer having a constituent unit derived from glycerin is at least one selected from the group consisting of an ethylene oxide-modified polyglycerin, a sulfonic acid-modified polyglycerin, a phosphonic acid-modified polyglycerin, a polyglycerin 4-vinylbenzoic acid ester, and a polyglycerin fatty acid ester in which the polyglycerin moiety has a branched structure, and wherein the composition for surface treatment does not comprise abrasive grains.

2. The composition for surface treatment according to claim 1, wherein the water-soluble polymer having a constituent unit derived from glycerin is at least one selected from the group consisting of a sulfonic acid-modified polyglycerin, a phosphonic acid-modified polyglycerin, a polyglycerin 4-vinylbenzoic acid ester, and a polyglycerin fatty acid ester in which the polyglycerin moiety has a branched structure.

3. The composition for surface treatment according to claim 1, further comprising an ionic dispersant.

4. The composition for surface treatment according to claim 3, wherein the ionic dispersant is a polymer compound having a sulfonic acid group or a sulfonic acid salt group.

5. The composition for surface treatment according to claim 4, wherein the sulfonic acid group-containing polymer is at least one selected from the group consisting of a sulfonic acid group-containing polyvinyl alcohol, a sulfonic acid group-containing polystyrene, a sulfonic acid group-containing polyvinyl acetate, a sulfonic acid group-containing polyester, and a salt thereof.

6. The composition for surface treatment according to claim 1, wherein the composition for surface treatment has a pH of 2.5 or lower.

7. The composition for surface treatment according to claim 1, wherein the object to be polished after polishing contains polysilicon.

8. A method for producing the composition for surface treatment according to claim 1, the method comprising mixing the water-soluble polymer having a constituent unit derived from glycerin, the acid, and the water.

9. The composition for surface treatment according to claim 1, wherein the water-soluble polymer has a weight average molecular weight of 1,000 or more and 2,000,000 or less.

10. The composition for surface treatment according to claim 1, wherein the water-soluble polymer is included in an amount of 0.02 g/kg or more and 5 g/kg or less with respect to the total amount of the surface treatment composition.

11. A surface treatment method, comprising performing a surface treatment of an object to be polished after polishing using the composition for surface treatment according to claim 1, and thereby reducing organic residues on the surface of the object to be polished after polishing.

12. The surface treatment method according to claim 11, wherein the surface treatment is carried out by rinse polishing or cleaning.

\* \* \* \* \*